(12) United States Patent
Motomura

(10) Patent No.: US 6,172,521 B1
(45) Date of Patent: Jan. 9, 2001

(54) PROGRAMMABLE LOGIC IC HAVING MEMORIES FOR PREVIOUSLY STORING A PLURALITY OF CONFIGURATION DATA AND A METHOD OF RECONFIGURATING SAME

(75) Inventor: Masato Motomura, Tokyo (JP)

(73) Assignee: NEC Corporation (JP)

( * ) Notice: Under 35 U.S.C. 154(b), the term of this patent shall be extended for 0 days.

(21) Appl. No.: 09/059,325

(22) Filed: Apr. 13, 1998

(30) Foreign Application Priority Data

Apr. 11, 1997 (JP) .................................................. 9-093297

(51) Int. Cl.[7] ........................ H03K 19/177; H03K 19/173
(52) U.S. Cl. .................................................. 326/40; 326/47
(58) Field of Search .................................. 326/38, 39, 40, 326/41, 47

(56) References Cited

U.S. PATENT DOCUMENTS

| | | | |
|---|---|---|---|
| 4,940,909 | * | 7/1990 | Mulder et al. .......................... 326/38 |
| 5,426,378 | * | 6/1995 | Ong ........................................ 326/39 |
| 5,760,602 | * | 6/1998 | Tan ......................................... 326/38 |
| 6,018,559 | * | 1/2000 | Azegami et al. ....................... 377/79 |

FOREIGN PATENT DOCUMENTS

| | | | |
|---|---|---|---|
| 2-30217 | 1/1990 | (JP) | ............................. H03K/19/177 |
| 4-286213 | 10/1992 | (JP) | ............................. H03K/19/173 |
| 5-63551 | 3/1993 | (JP) | ............................. H03K/19/173 |
| 8-307246 | 11/1996 | (JP) | ............................. H03K/19/177 |
| 8-330945 | 12/1996 | (JP) | ............................. H03K/19/177 |
| 9-307428 | 11/1997 | (JP) | ............................. H03K/19/177 |

OTHER PUBLICATIONS

"XC6200 Field Programmable Gate Arrays" Jun. 1, 1996 (Version 1.0) Advance Product Specification pp. 4–253 to 4–286.

* cited by examiner

*Primary Examiner*—Michael Tokar
*Assistant Examiner*—James H. Cho
(74) *Attorney, Agent, or Firm*—Hayes, Soloway, Hennessey, Grossman & Hage, P.C.

(57) ABSTRACT

In order to achieve rapid reconfiguration of logic elements in a programmable logic device, a plurality of memory logic modules are arranged in a two-dimensional array. At least one logic element is provided in each of the plurality of memory logic modules. The logic element is provided with a configuration memory into which configuration data can be written to specify logic functions of the logic element. A memory element is provided in each of the plurality of memory logic modules. The memory element stores a plurality of configuration data with respect to the logic element, and one of the plurality of configuration data is written into the configuration memory of the logic element to configure or reconfigure the logic element.

9 Claims, 10 Drawing Sheets

PROGRAMMABLE LOGIC IC HAVING MEMORIES FOR PREVIOUSLY STORING A PLURALITY OF CONFIGURATION DATA AND A METHOD OF RECONFIGURATING SAME

BACKGROUND OF THE INVENTION

1. Field of the Invention

The present invention relates generally to a programmable logic IC (integrated circuit) whose logic functions can be determined by the user, and more specifically to such a programmable logic IC which is provided with memories each for storing a plurality of different sets of configuration data, each of which is used to configure or reconfigure the logic IC. Still further, the present invention relates to a method of reconfigurating the programmable logic IC. The programmable logic IC is fabricated using a conventional LSI or VLSI (very large scale integration) technology,

2. Description of the Related Art

As is known in the art, a programmable logic IC (or device), such as an FPGA (field programmable gate array), a CPLD (complex programmable logic device), etc., is comprised of a plurality of logic elements which are two-dimensionally arranged. Logic operations, carried out by the programmable logic IC, are determined by logic functions of each logic element in combination with interconnections between the logic elements. The information for defining the logic operations of the programmable logic IC is referred to as configuration data. The configuration data, for example, includes a look-up table having two to six inputs for implementing a wide variety of logic functions. The look-up table is used to implement the logic operations of each logic element. Further, the configuration data includes data for determining on/off operations of switches of the logic elements, thereby to specify the interconnections between the logic elements. Each of the conventional logic elements is provided with a memory such as an SRAM (static random access memory), which is referred to as a configuration memory.

When it becomes necessary to reconfigure the programmable logic IC, a part or all of the data, already stored in the configuration memory, should be changed. This operation of data rewriting is called reconfiguration. In order to implement the reconfiguration, new programming data should be transferred to the configuration memory from an external non-volatile memory.

According to one known technique, reconfiguring the programmable logic IC is carried out in a manner similar to writing data into a RAM That is, the configuration memory is supplied, from a suitable external memory, with the addresses at which the new configuration data are to be written and also with the new configuration data itself. Therefore, the reconfiguration can be implemented by successively transferring "data words" each having a predetermined bit-length. By way of example, such a conventional reconfiguring technique is used with a device named XC6200 available at Xilinx, Corporation, as described in a reference manual entitled "XC6200 Field Programmable Gate Arrays" published Jun. 1, 1996 by that corporation.

A programmable logic IC has found extensive use in the case where the time period for circuit design is limited and the logic functions are changed depending on different applications. It is however a recent trend to positively use the ability of reconfiguring the programmable logic IC. Such a logic IC is referred to as a custom computer or a reconfigurable computer. The programmable logic IC, which is used as a custom computer, takes the advantage of dynamically reconfiguring the device's hardware (viz., the device's logic operations) so as to reconstruct the most desirable data processing hardware structure. It is expected that this type of custom computer can effectively be applied to technical fields such as data coding, encipherment and decipherment, etc., which are difficult to adequately be processed using the general architecture available in usual microprocessors.

The prior art has encountered the drawbacks that it takes too long to completely reconfigure the programmable logic IC. The reason for this is that the programmable logic IC is externally supplied with the new configuration data, In addition, it is difficult to achieve a sufficient data bandwidth so as to enable rapid transfer of the reconfiguration data. By way of example, the time, needed to reconfigure all the programmable logic IC, ranges between about 100 ms and about 100 $\mu$s, which respectively correspond to a range between of 5-million cycles and 5-thousand cycles in the case where the programmable logic IC operates under a clock rate of 50 MHz. More specifically, assuming that the amount of the configuration data, needed to reconfigure a programmable logic IC, is 256 kbits. This corresponds to a programmable logic IC comprised of a plurality of logic elements, each of which has a configuration memory of 64-bit, and which are arranged in a matrix of 64×64. In this instance, if such a programmable logic IC is to be reconfigured using a 32-bit data bandwidth at a clock rate of 50 MHz, then the time interval needed to complete the reconfiguration of all the programmable logic IC becomes as long as 160 $\mu$s.

As is known, when a programmable logic IC is used as a custom computer, it is necessary to frequently change (viz., reconfigure) the contents of each configuration memory of the programmable logic IC. The reconfiguration occurs each time the application program is changed, or even during the same application program. Accordingly, as mentioned above, if the reconfiguration time period is as long as more than 100 $\mu$s, it is not practical to use such a conventional programmable logic IC as a custom computer in an environment where the reconfiguration is frequently necessary. More specifically, if the time period needed to complete the reconfiguration is about 100 $\mu$s (for example), such usage of a programmable logic IC as a custom computer may be limited to the case where the reconfiguration occurs at a time interval ranging from 1 ms to 10 ms (for example).

SUMMARY OF THE INVENTION

It is therefore an object of the present invention to provide a programmable logic IC which can be reconfigured in a very short time period compared with a conventional programmable IC.

Another object of the present invention is to provide a method of reconfiguring a programmable logic IC in a very short time period compared with a conventional programmable IC.

In brief, these objects are achieved by techniques where in order to achieve rapid reconfiguration of logic elements in a programmable logic device, a plurality of memory logic modules are arranged in a two-dimensional array. At least one logic element is provided in each of the plurality of memory logic modules. The logic element is provided with a configuration memory into which configuration data can be written to specify logic functions of the logic element. A memory element is provided in each of the plurality of memory logic modules. The memory element stores a plurality of configuration data with respect to the logic element, and one of the plurality of configuration data is written into the configuration memory of the logic element to configure or reconfigure the logic element.

One aspect of the present invention resides in a programmable logic device comprising: a plurality of memory logic modules arranged in a two-dimensional array; at least one logic element provided in each of the plurality of memory logic modules, the logic element being provided with a configuration memory into which configuration data can be written to specify logic functions of the logic element; and a memory element provided in each of the plurality of memory logic modules, the memory element storing a plurality of configuration data with respect to the logic element, one of the plurality of configuration data being wrien into the configuration memory of the logic element to implement configuration or reconfiguration thereof.

Another aspect of the present invention resides in a method of implementing configuration or reconfiguration of logic elements provided in a programmable logic device, comprising the steps of; writing a plurality of configuration data into a memory element provided in each of a plurality of memory logic modules which are arranged in the programmable logic device in a two-dimensional array, the plurality of configuration data being associated with at least one logic element provided in each of the plurality of memory logic modules, and writing one of the plurality of configuration data into the logic element in response to a signal instructing the configuration or the reconfiguration of the logic element.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Before turning to the details of the embodiments of the present invention, it is deemed preferable to describe, with reference to FIGS. 1–4, the principles underlying the present invention.

Figure 1:
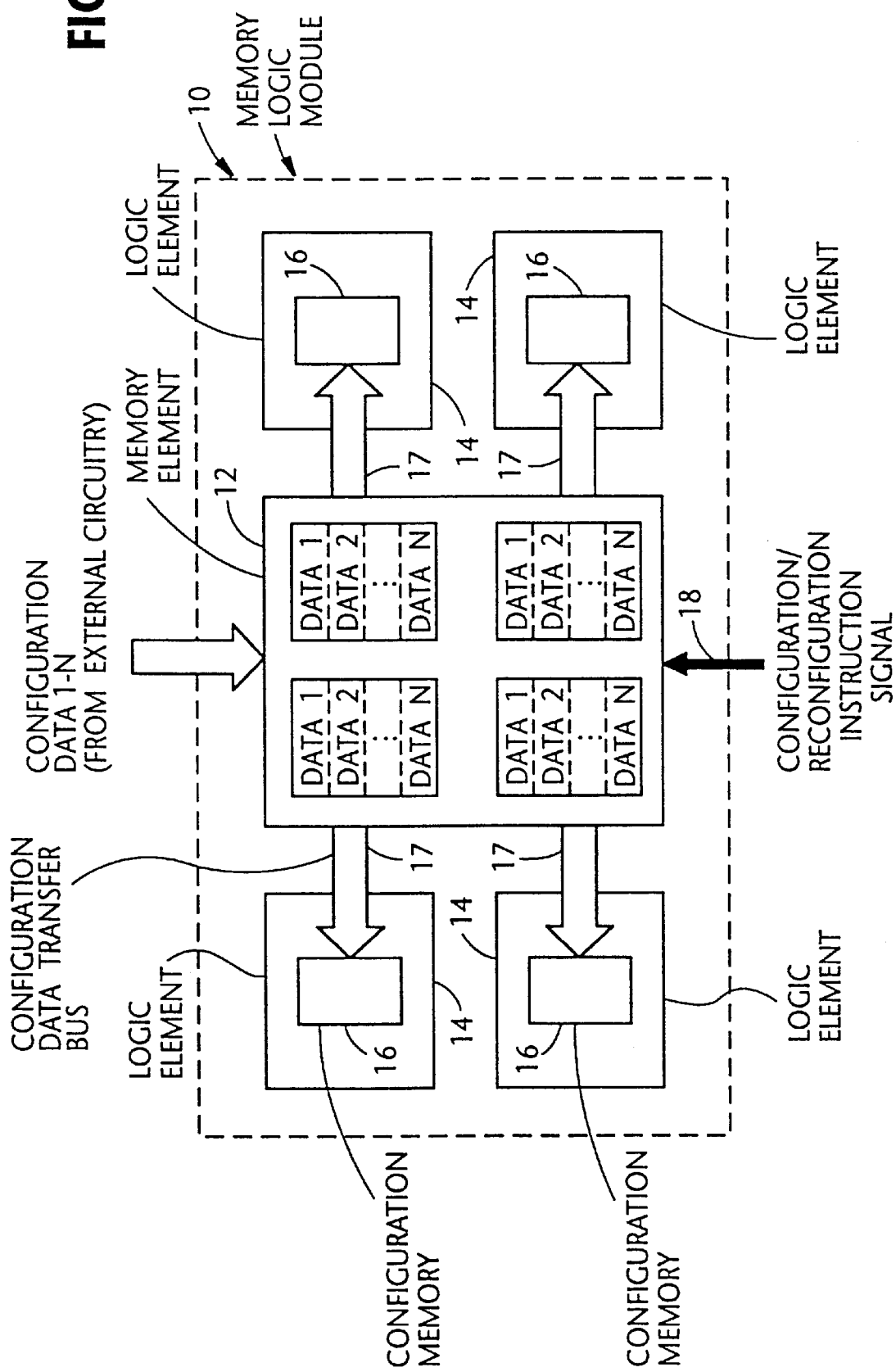
FIG. 1 is a block diagram schematically showing a principle underlying a first embodiment of the present invention.
Figure 2:
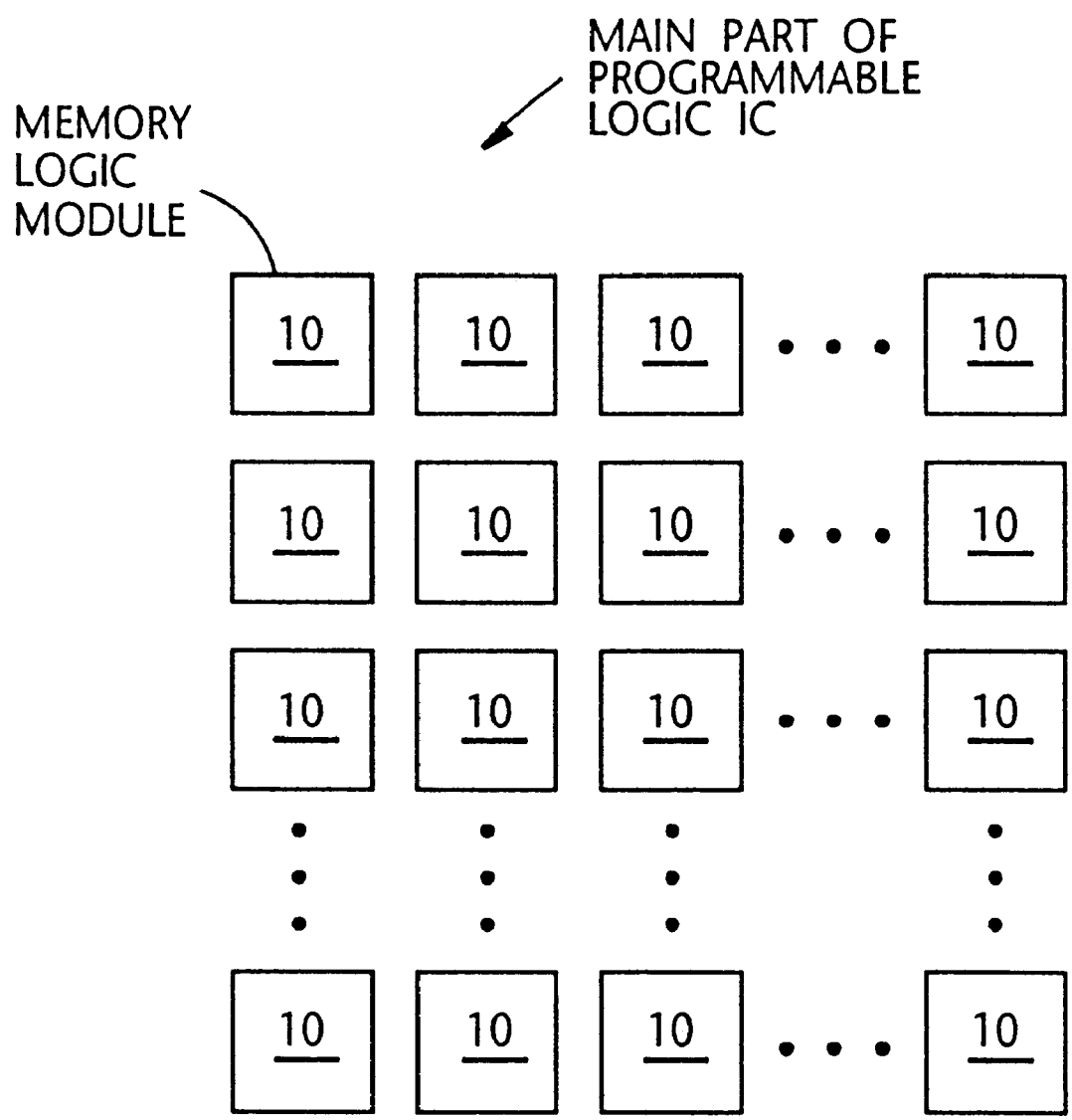
FIG. 2 is a block diagram schematically showing a main part of a programmable logic IC, which comprises a plurality of identical memory logic modules one of which has been shown in FIG. 1.

FIG. 1 is a block diagram schematically showing one memory logic module 10, according to a first embodiment, which forms part of a programmable logic IC fabricated using a conventional LSI or VLSI technology. As schematically shown in FIG. 2, the programmable logic IC is comprised of a plurality of memory logic modules 10, shown in FIG. 1, which are two-dimensionally arranged.

The memory logic module 10 of FIG. 1 generally comprises a memory element 12 and four logic elements 14. The number of the logic elements 14 is, however, in no way limited to "four" and can arbitrarily be determined depending on the capacity of the memory element 12 and IC fabrication considerations. The memory element 12 is provided with four memory sections in this particular case, each of which has a capacity of storing a plurality of different sets of configuration data 1-N. The configuration data 1-N are written into the memory element 12 from an external memory (not shown) under control of a CPU (central processing unit)(not shown). The number "N" of configuration data is determined by the capacity of the memory element. Each of the logic elements 14 is provided with a configuration memory, denoted by reference numeral 16, to which one of the configuration data 1-N, stored in the corresponding memory section of the memory element 12, is transferred in parallel in response to a configuration/reconfiguration instruction signal 18.

It is understood that the present invention features that the memory element 12 previously stores a plurality of configuration data 1-N. Further, the configuration data stored in the memory 16 is rapidly replaced (viz., reconfigured) with another configuration data stored in the memory element 12 via the configuration data transfer bus (depicted by an arrow) 17 arranged in parallel between the memories 12 and 16.

According to the present invention, the reconfiguration is able to be implemented in one cycle to few cycles.

Figure 3:
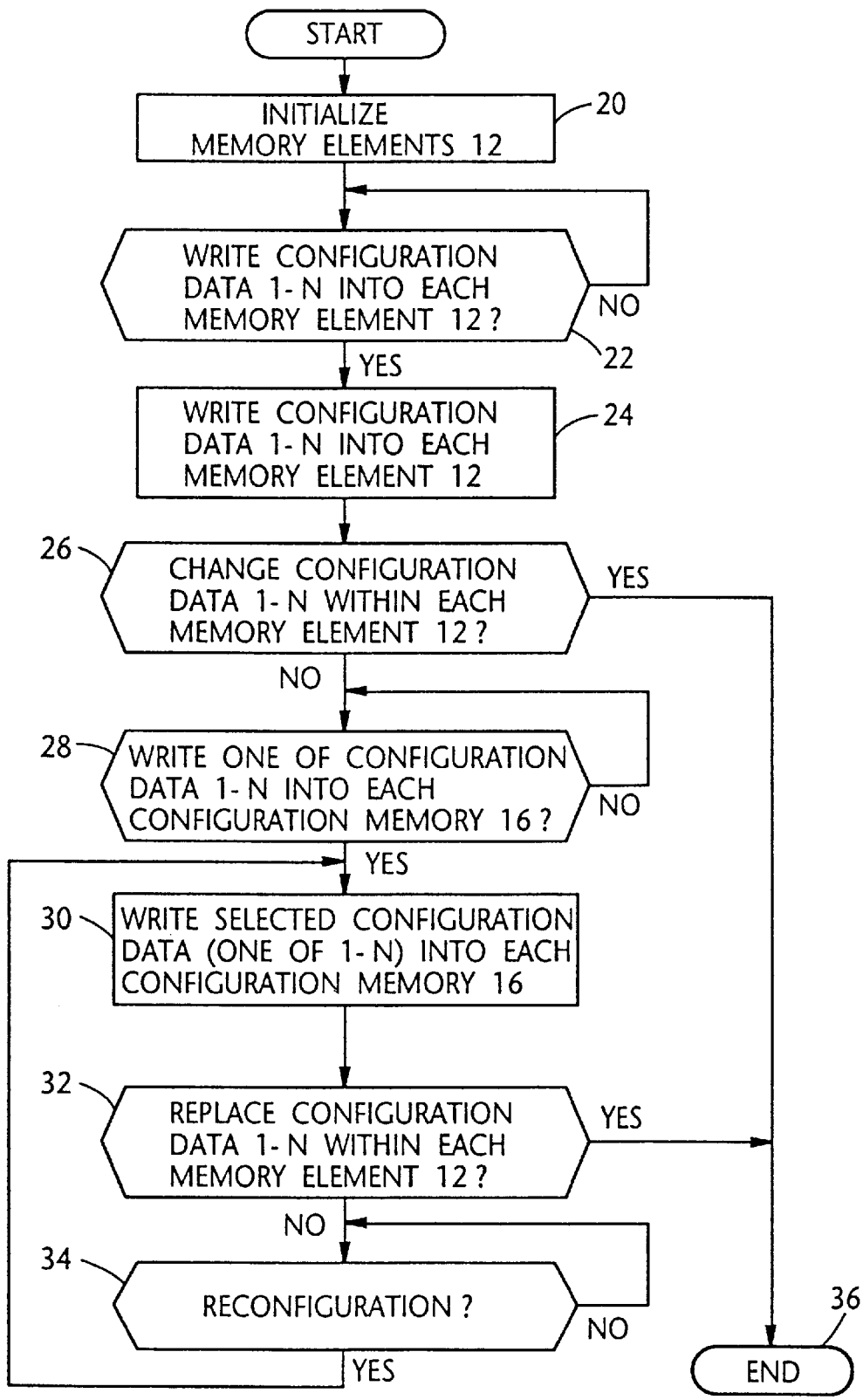
FIG. 3 is a flow chart depicting steps which characterize the operation of the first embodiment.

Referring to FIG. 3, there is shown a flow chart depicting steps which characterize the operation of the first embodiment.

As shown in FIG. 3, the memory elements 10 are initialized (viz., reset) at step 20, after which a check is made to determine if an instruction is generated which indicates writing the sets of configuration data 1-N into each memory element 12 module 10 (step 22). If the answer to the inquiry made at step 22 is positive (viz., yes), the configuration data 1-N are written into each memory element 12 from a suitable external memory (step 24). Otherwise (viz., the answer to the inquiry at step 22 is negative), the routine waits for the issuance of the above mentioned configuration data write instruction. At step 26, a check is made to determine if the configuration data 1-N are to be replaced (or erased). This implies that the data 1-N already stored in each memory element 12 should be replaced with new sets of configuration data. If the answer to the inquiry made at step 26 is affirmative, the routine is terminated at step 36. However, the replacement of the configuration data 1-N within the memory element 10 is not directly concerned with the present invention, and thus a further description thereof will be omitted for simplifying the disclosure.

Subsequently, at step 28, a check is further made to determine if one of the configuration data 1-N should be written into the configuration memory 16 of each logic element 14. If the answer made at the inquiry at step 28 is affirmative (viz., yes), the routine proceeds to step 30, at which one of the configuration data 1-N is selected and written into each configuration memory 16. Thereafter, as in step 26, a check is made to determine if the configuration data 1-N are to be replaced (or erased). If the answer to the inquiry made at step 32 is affirmative, the routine is terminated at step 36. Otherwise (viz., the answer at step 32 is negative), a check is further made to determine if the configuration data, already stored in each memory, should be changed (viz., reconfiguration should be implemented). If the content of the configuration memory 16 has to be replaced (viz., reconfiguration should be carried out), the routine returns to step 30 whereat another configuration data is written into the memory so as to replace that which is already stored therein. In the above, the configuration data 1-N are written into all the memory elements 12. However, it is within the scope of the present invention to write the data 1-N into part of the memory elements 12 while writing another sets of configuration data into the remaining memory elements 12.

Figure 4:
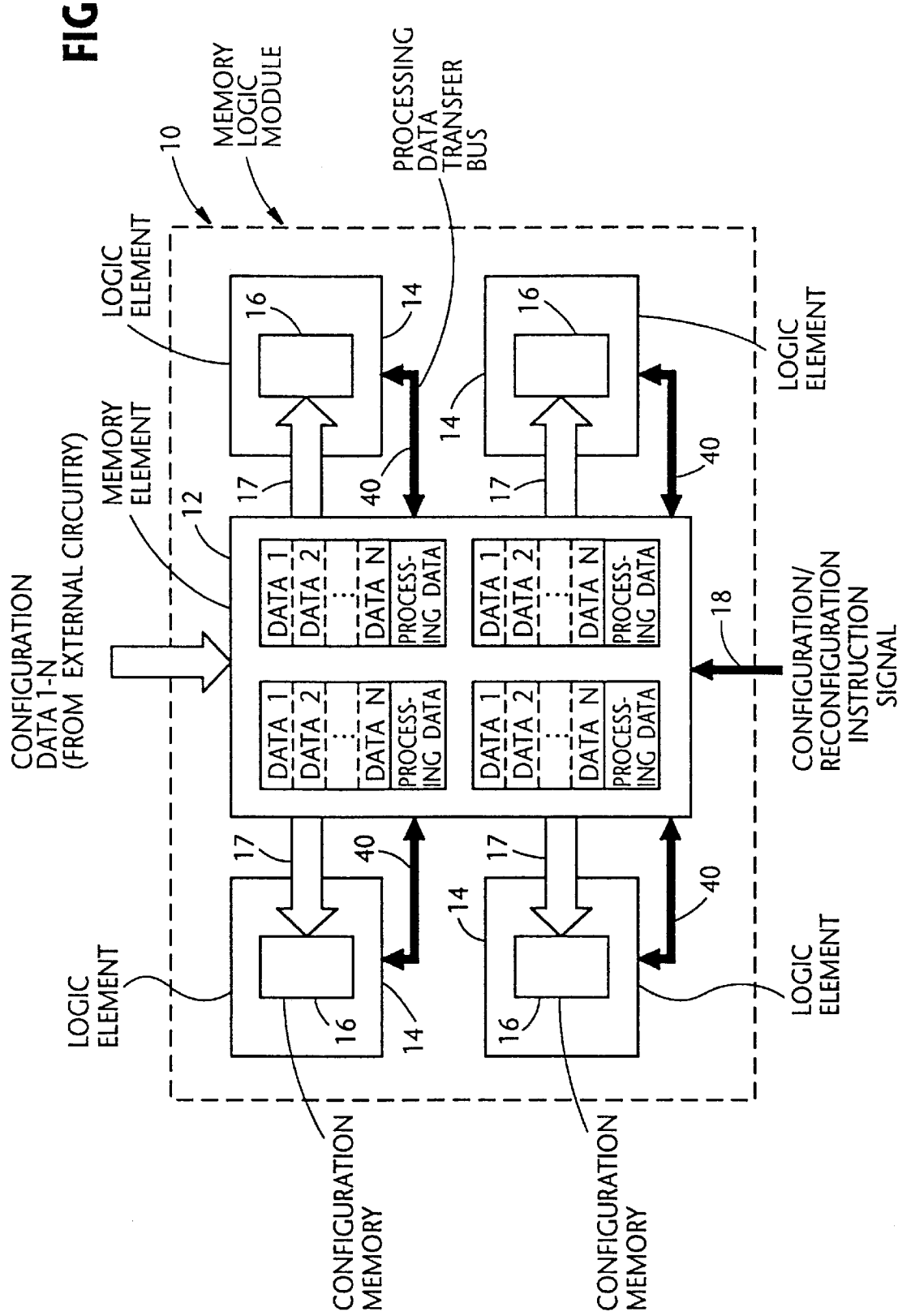
FIG. 4 is a block diagram schematically showing a principle underlying a second embodiment of the present invention.

Referring to FIG. 4, a brief description of a second embodiment will be given. The second embodiment differs from the first embodiment in that the memory element 12 further stores a plurality of sets of logic processing data ("four" in this case), which can be exchanged between the memories 12 and 16 via a processing data transfer bus 40 for parallel data transfer. The logic processing data is used when implementing the logic functions at the logic elements 16. Other than this, the first and second embodiments are substantially identical with each other.

The first embodiment will further be described with reference to FIGS. 5–9.

Figure 5:
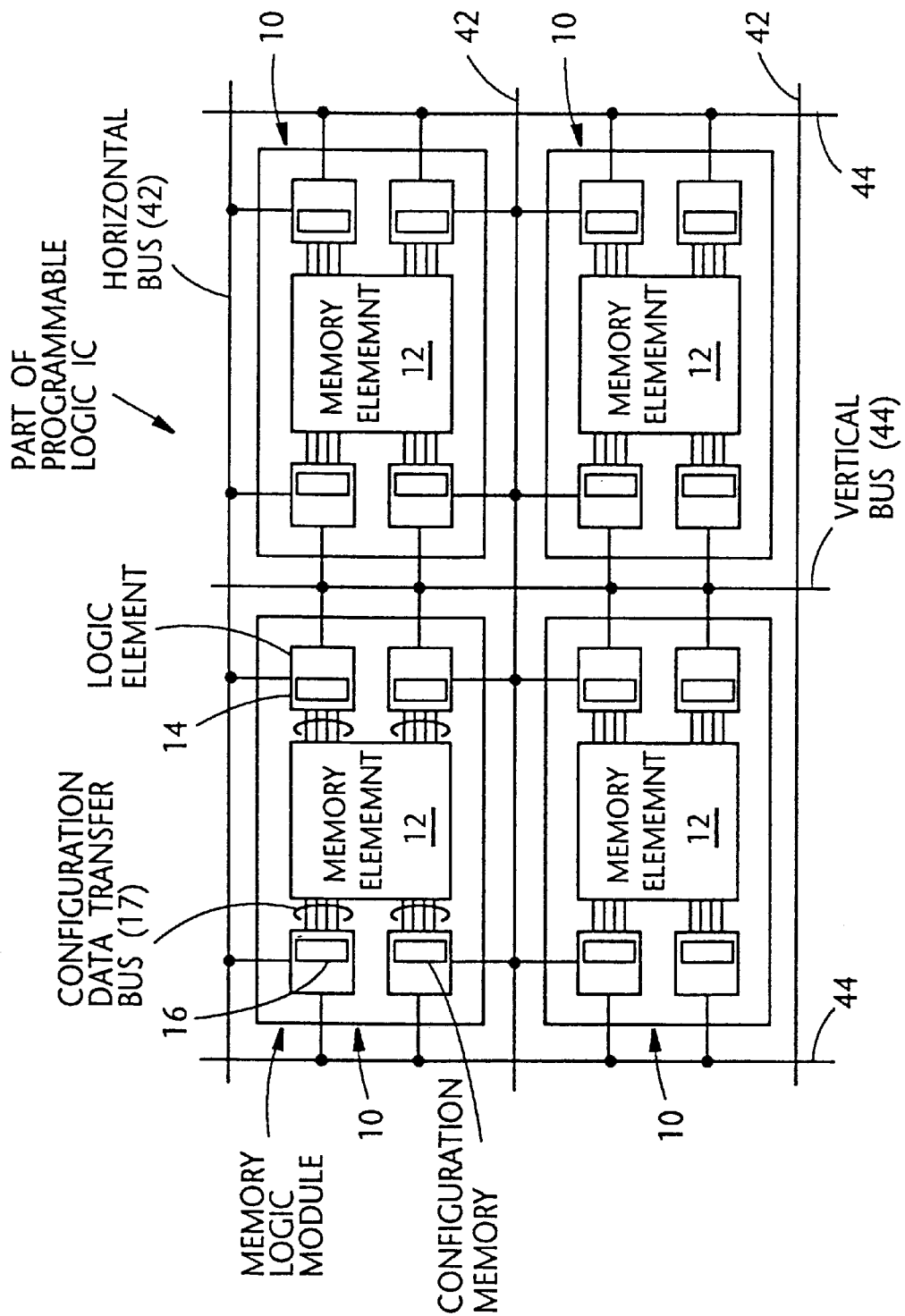
FIG. 5 is a block diagram schematically showing four memory logic modules arranged in a two-dimensional array of 2×2 according to the first embodiment.

For the sake of simplifying the disclosure, FIG. 5 shows part of a programmable logic IC which includes only four memory logic modules 10 (each shown in FIG. 1) arranged in an array of 2×2 in this particular case. The configuration of each memory logic modules 10 has already been mentioned and thus, the further description thereof will be omitted. Each of the logic elements 14 has input and output terminals which may be respectively coupled to horizontal buses 42 and vertical buses 44 depending on logical connections within the logic element 14. That is, the actual coupling of the input and output terminals of each logic element 14 with the horizontal and vertical buses 42 and 44, is controlled by the configuration data stored in the logic element 14. The logic elements 14 are coupled with the other ones in the programmable logic IC by way of the horizontal and vertical buses 42 and 44. It is possible to couple the horizontal and vertical buses 42 and 44 via a logic element (s) 14. Thus, the configuration data stored in the memories 16 are able to program the logic functions of each logic element 14 and the interconnections between the elements 14. In other words, these logical situations can be changed by implementing the reconfiguration.

In FIG. 5, the number of lines of each configuration data transfer bus 17 which is illustrated is "four" due to the limited space of the drawing, and actually is determined considering the most effective data transfer. Still further, as mentioned in the opening paragraphs, the configuration data, for example, includes a look-up table having two to six (for example) inputs for implementing a wide variety of logic functions. The look-up table is used to implement the logic operations of each logic element. Further, the configuration data includes data for determining on/off operations of switches of the logic elements, thereby to specify the interconnections between the logic elements. It is understood that the memory logic modules 10 can be selected on a basis of column, row, and divided square array.

Figure 6:
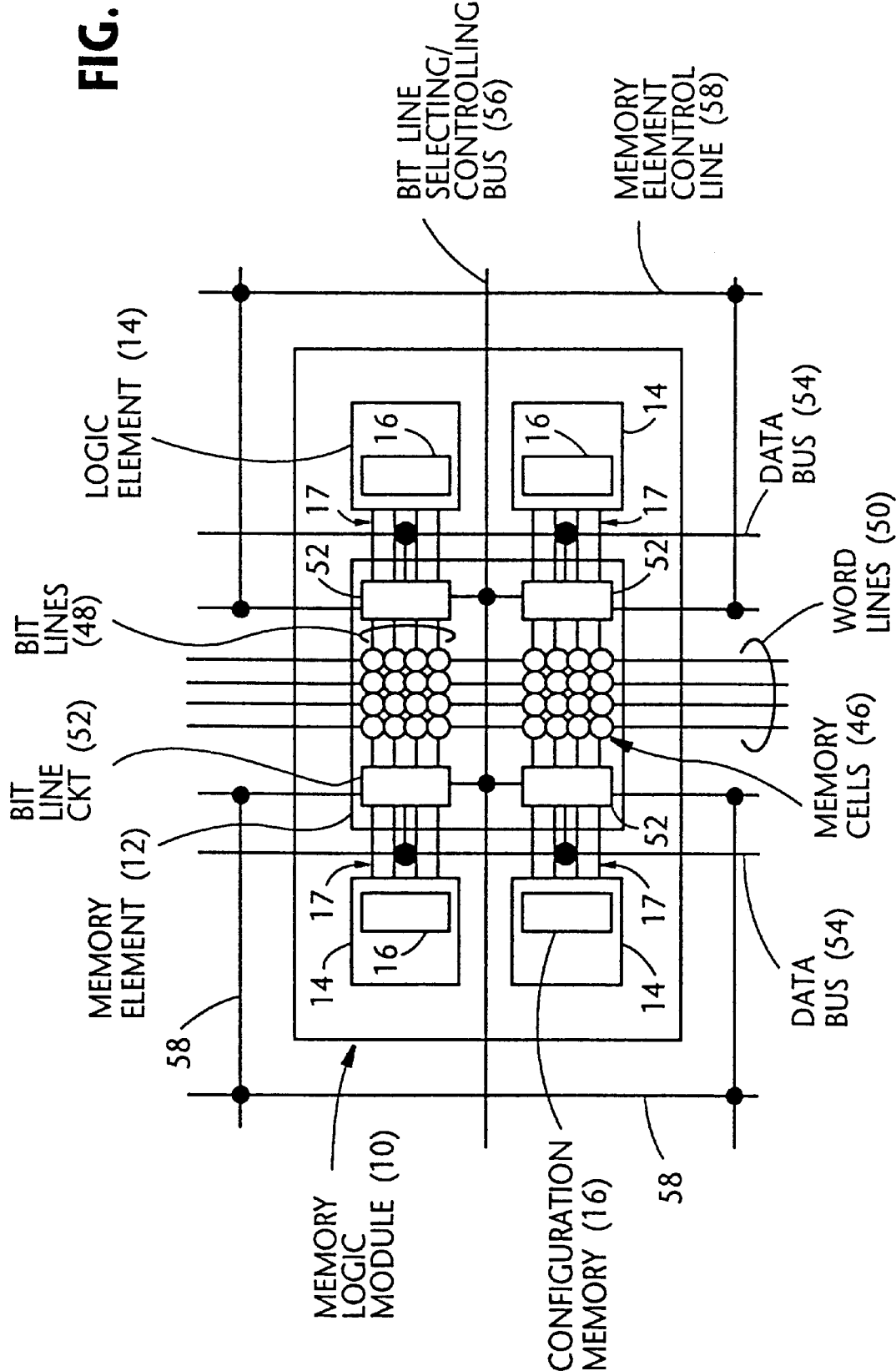
FIG. 6 is a block diagram showing in detail one of the memory logic modules of FIG. 5.
Figure 7:
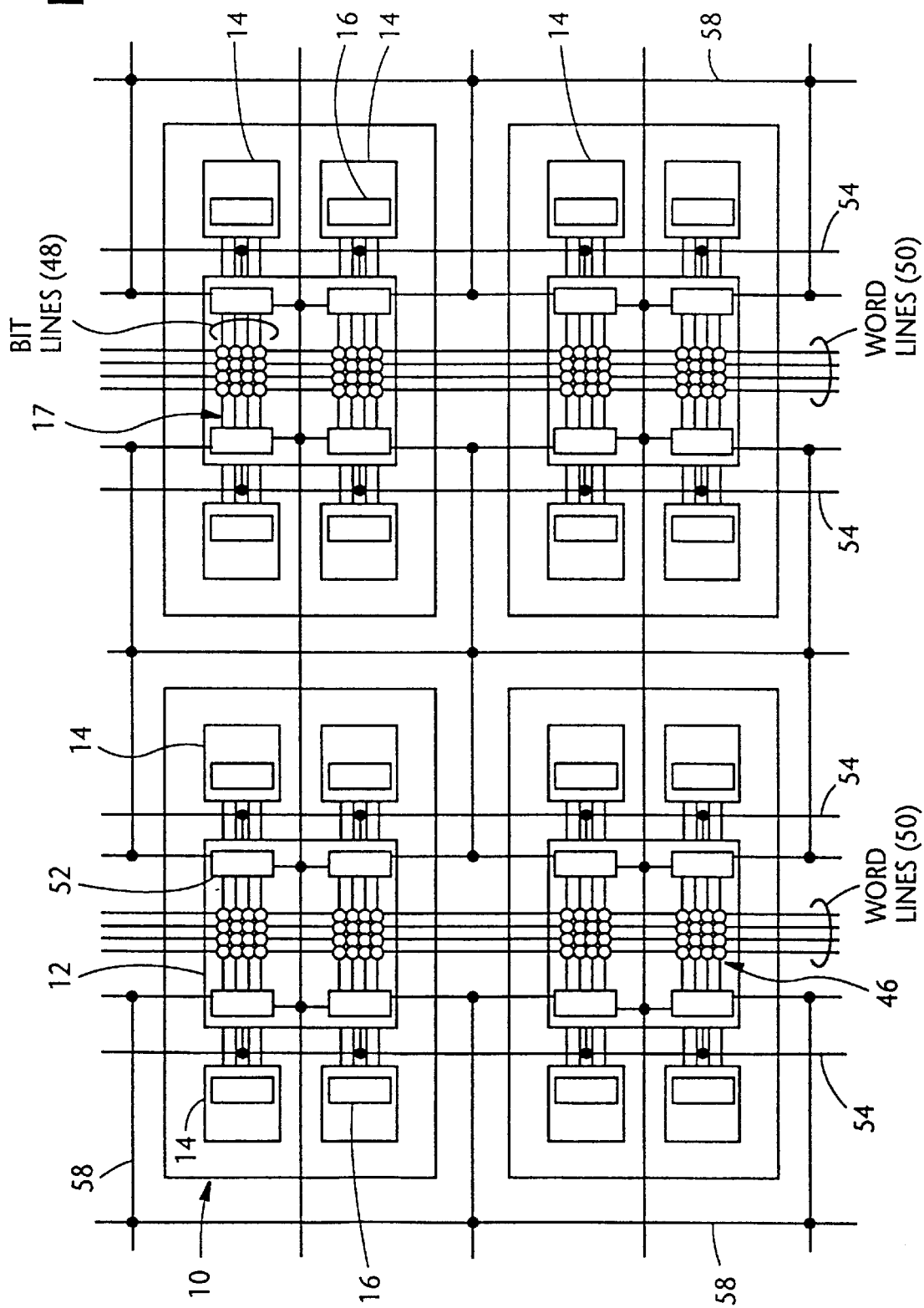
FIG. 7 is a block diagram schematically showing four memory logic modules arranged in a two-dimensional array of 2×2, each of the memory logic modules having been shown in FIG. 6.

FIG. 6 is a block diagram showing the detail of one memory logic module 10 together with data buses and signal lines associated therewith, while FIG. 7 illustrates an array of four memory logic modules 10 each of which is shown in FIG. 6. However, in FIGS. 6 and 7, the horizontal and vertical buses 42 and 44 shown in FIG. 5 are omitted merely for the sake of simplifying the drawings. As best shown in FIG. 6, the memory element 12 comprises a plurality of memory cells 46 arranged in a two-dimensional array. The memory cells 46 are respectively coupled to bit lines 48 and word lines 50. Data exchange (viz., data read/write) is implemented, via the bit lines 48, between the memory cells 46 and a corresponding bit line circuit 52. The data read and/or write operations between the memory element 12 and an external circuit (not shown), are carried out using data buses 54. Which memory cell 46 is to be accessed from the external circuit is determined by a control signal appearing on a bit line selecting/controlling bus 56. The bit lines 48 are respectively coupled, via the bit line circuit 52, to the configuration data transfer buses 17.

When one of the configuration data 1-N is to be transferred from the memory element 12 to the corresponding configuration memory 16, one or more of word lines 50 are selected so as to read the configuration data stored in the corresponding row(s) of the memory cells 46. The configuration data thus derived from the selected memory cells 46 are transferred, via the bit line circuit 52 and the data transfer bus 17, to the configuration memory 16. A signal appearing on a memory element control line 58 is used to instruct whether the memory element 12 should be accessed by the external circuit or the configuration data should be transferred from the memory element 12 to the configuration memory 16.

Figure 8:
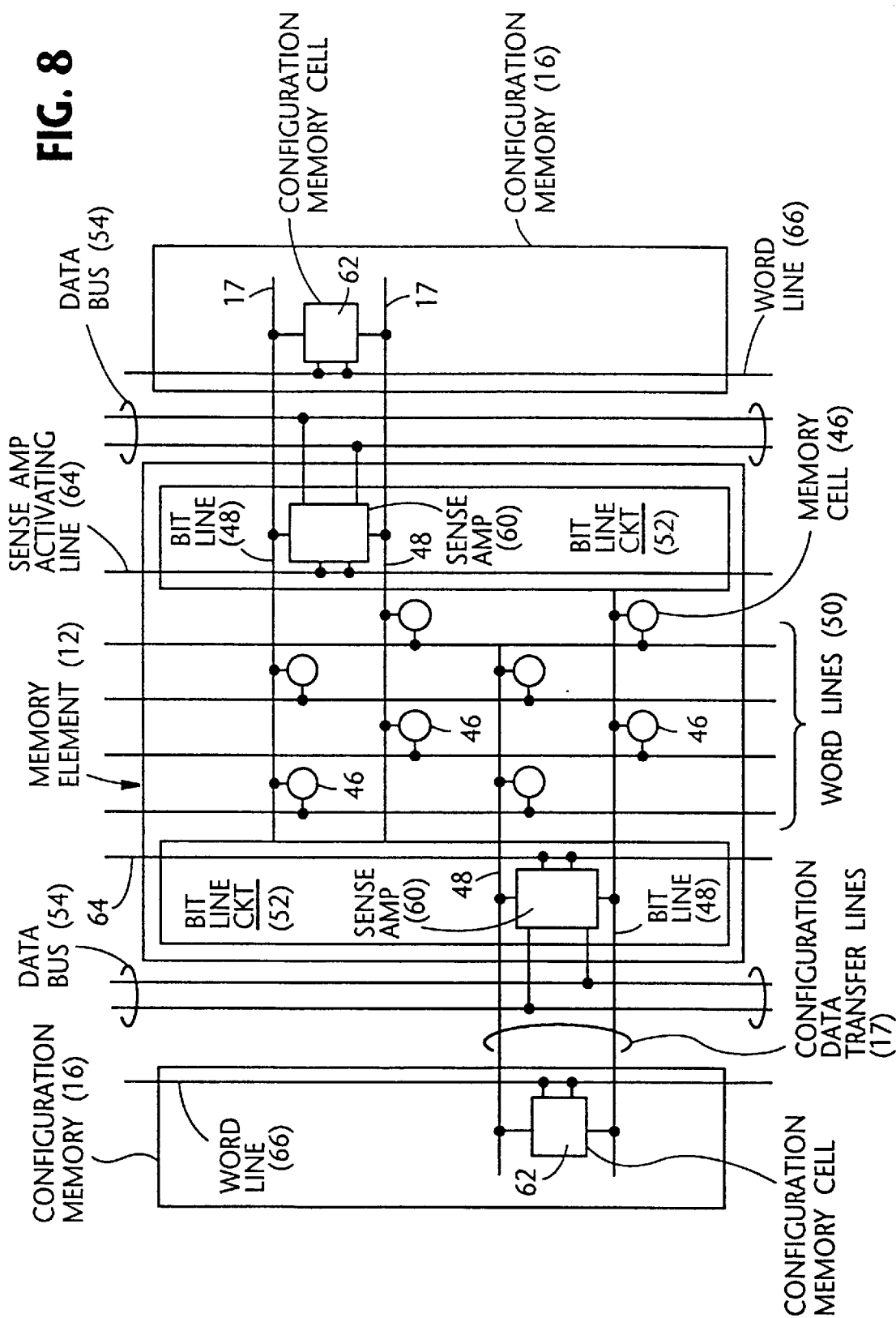
FIG. 8 is a block diagram showing part of one concrete example of the first embodiment.

FIG. 8 shows a concrete example of the first embodiment. It is to be noted that the arrangement shown in FIG. 8 shows part of the programmable IC. In this case, the memory element 12 takes the form of a DRAM (dynamic random access memory) while the configuration memory 16 is constructed by a SRAM. In general, the bit line pitch (viz., the distance between adjacent bit lines 48) of a DRAM is small and thus, it is often the case to alternately extend pairs of bit lines therefrom in the manner shown in FIG. 8.

The configuration data derived, via the bit lines 48, from the memory cells 46 are amplified by a sense amplifier 60 (in fact a plurality of amplifiers are used). The amplified data are then written into the configuration memory cells 62 of the configuration memory 16 by way of the configuration data transfer bus 17. In the above, each sense amplifier 60 is activated by a high level signal appearing on a sense amplifier activating line 64. Further, each configuration memory cell 62 is activated using a word line 66. Which configuration data is selected (or derived) is determined by the word line 50 which assumes a high level. Although it may not necessarily be clear from FIG. 8, it will be understood that when only one of the word lines 50 is selected, are all of the logic elements within one memory logic module configured or reconfigured. As shown in FIG. 8, the two adjacent bit lines are used to derive the configuration data. However, a piece of the configuration data appears only on one of these two adjacent bit lines. These two bit lines are coupled to the sense amplifier 60 at which differential amplification is implemented. As shown in FIG. 8, a pair of bit lines 48 is directly coupled to corresponding one pair of configuration data transfer lines 17.

Figure 9:
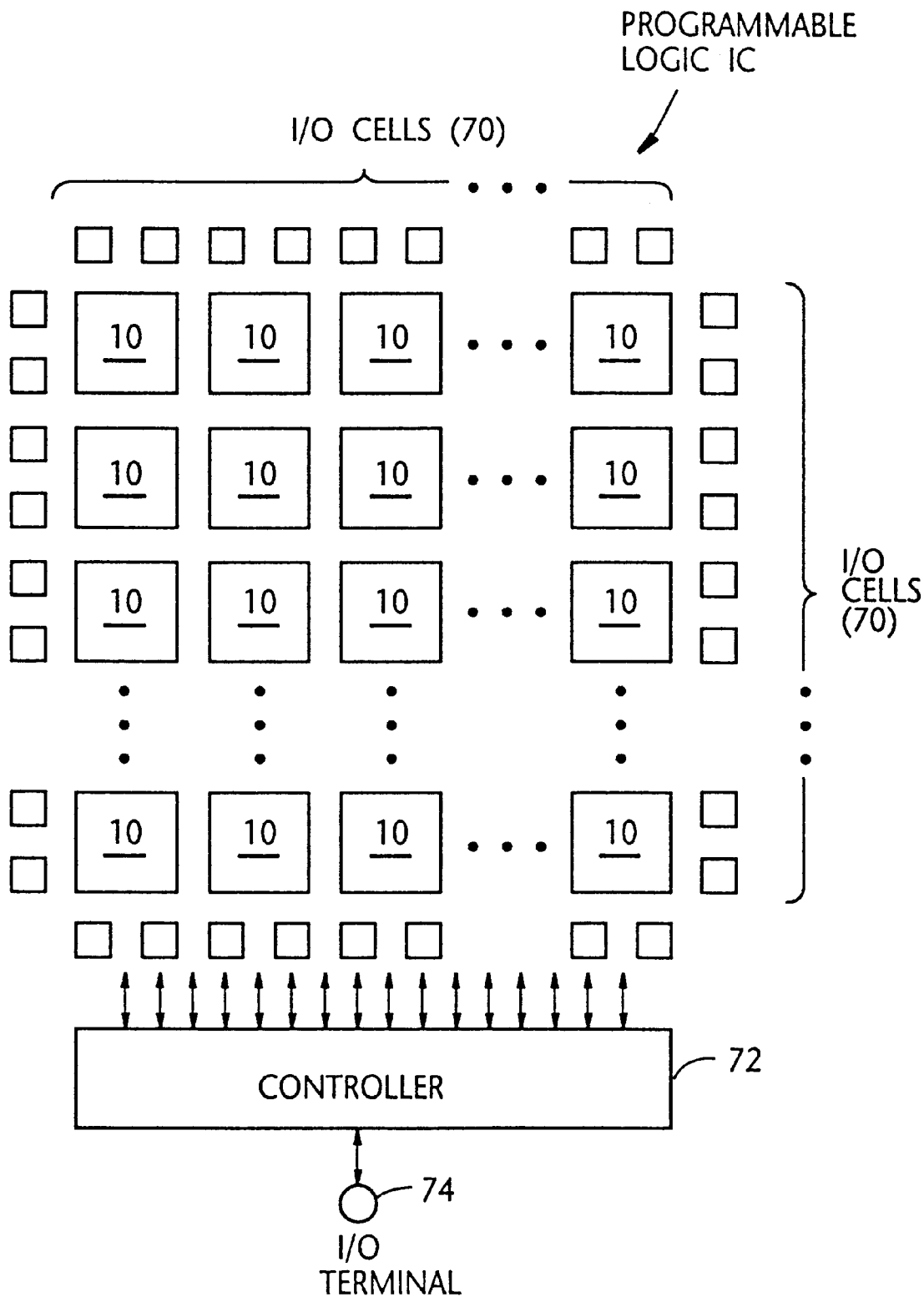
FIG. 9 is a diagram schematically showing an array of memory logic modules together with associated function blocks.

FIG. 9 is a diagram schematically showing a programmable logic IC which comprises an array of memory logic modules 10, a plurality of input/output cells 70, a controller 72, and an input/output terminal 74. For the sake of simplifying the drawing, the wiring between the modules 10 is omitted. The programmable logic IC shown in FIG. 9 can be coupled to another one via the input/output cells 70. The input/output terminal 74 is used, for example, to supply the programmable logic IC of FIG. 9 with the configurations data 1-N, the instructions signals of configuration and reconfiguration, processing data which are used when each logic element 14 implements the logic functions thereof.

As mentioned above, the memory elements 12 provided in one programmable logic IC are able to concurrently transfer the configuration data to all the logic elements provided in the elements 12.

Figure 10:
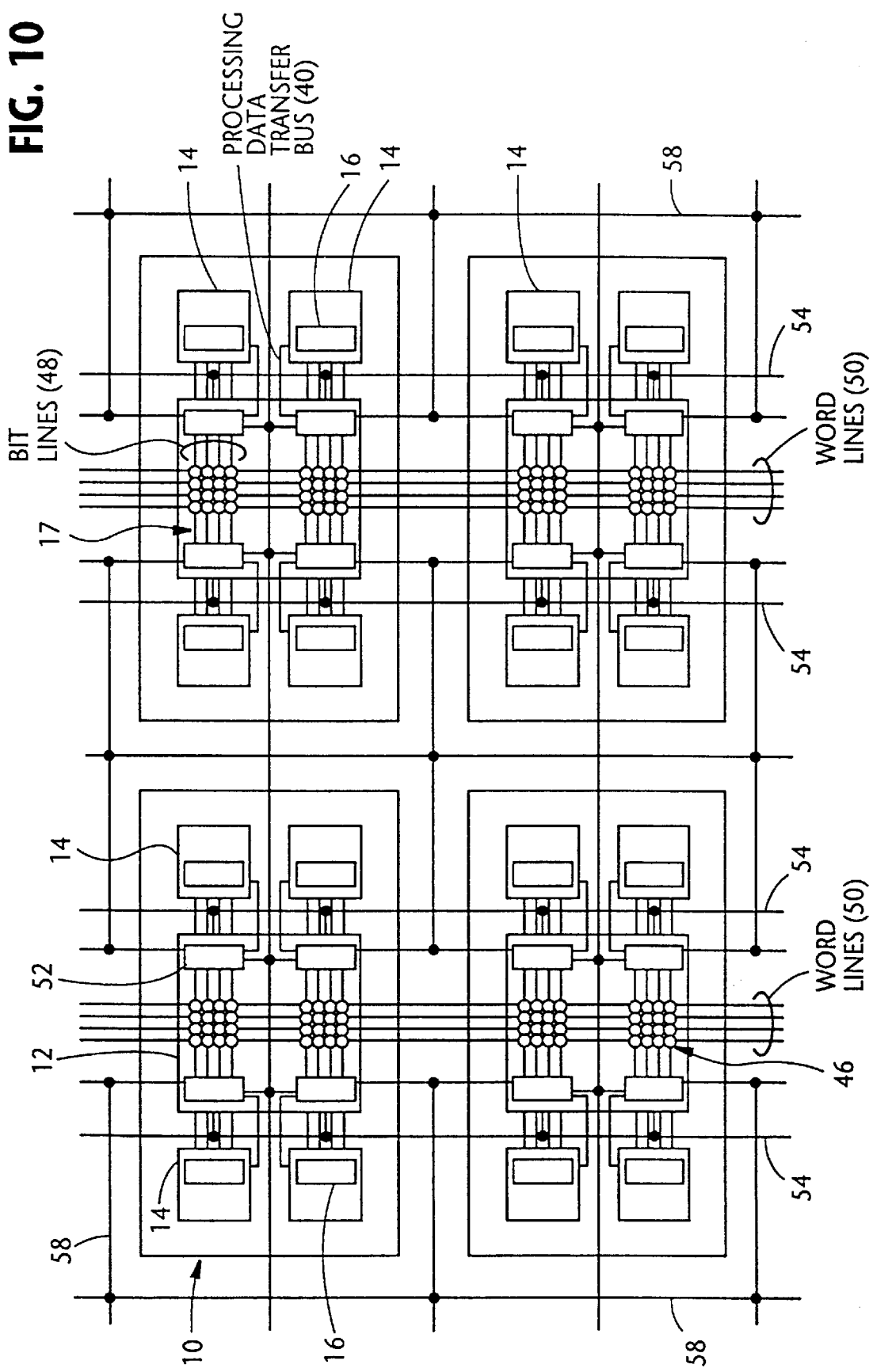
FIG. 10 is a block diagram schematically showing four memory logic modules arranged in a two-dimensional array of 2×2 according to the second embodiment.

FIG. 10 is a block diagram showing the second embodiment. As mentioned above, the second embodiment differs from the first embodiment in that the memory element 12 further stores a plurality of logic processing data. This has been referred to in connection with FIG. 4. The processing data can be exchanged between the memories 12 and 16 via a processing data transfer bus 40. The logic processing data is used when implementing the logic functions at the logic elements 14. Other than this, the first and second embodiments are substantially identical with each other. Since the second embodiment stores the logic processing data in each memory element, a plurality of logic elements 14 are able to implement parallel data processing while independently accessing the corresponding memory elements 12.

As shown in FIGS. 7 and 8, the memory elements 12 line up in columns and accordingly, it is possible to randomly access the memory elements 12 externally as in a conventional DRAM or SRAM. Further, the logic elements 14 also line up in columns and thus, the same discussion can be applied thereto. As a result, the data derived from one programmable logic IC can be applied to another programmable logic IC.

In the first or second embodiment, assuming that a programmable logic IC is comprised of the logic elements 14 in an array of 64×64. In this particular case, the number of the memory elements 12 is 16×16 in an array because each memory element 12 is assigned to the four logic elements 14. Further assuming that one configuration data consists of 64 bits. Then, the total number of bits of the configuration data, stored in all the 64×64 logic elements 14, becomes 256 Kbits. Generally, the number of bits, which are read from a DRAM to each sense amplifier 60 (FIG. 8) at a time, ranges from 16 Kbits to 32 Kbits. Further, the time needed to read out these bits to the sense amplifier is about 10 ns. Further, assuming that about 5 ns is needed to transfer from each sense amplifier 60 to the corresponding configuration memory cell 62, then the total time required to transfer from the memory element 12 to the logic element 14 is about 15 ns. Accordingly, the configuration data of 256 Kbits can be written into all the logic elements 14 in 240 ns to 120 ns.

As in the above, assuming that a programmable logic IC is comprised of the logic elements in an array of 64×64 in the first or second embodiment. Further, assuming that each memory element 12 takes the form of DRAM and is able to store 32 Kbits therein. In this case, the total number of bits of the memory elements 12 of the entire programmable logic IC becomes 32 Mbits. If each configuration data consists of 64 bits, then the number of configuration data stored in each memory element 12 with respect to each logic memory is a maximum of 128. In the case where each of the memory elements 12 stores different sets of configuration data, a vast number of different logic functions can be realized with each programmable logic IC.

It will be understood that the above disclosure is representative of only two possible embodiments of the present invention and that the concept on which the invention is based is not specifically limited thereto.

What is claimed is:

1. A programmable logic device comprising:
    a plurality of memory logic modules arranged in a two-dimensional array;
    a first memory provided in each of said plurality of memory logic modules, said first memory receiving, from an external circuit, configuration data and storing said configuration data therein; and
    at least one logic element provided in each of said plurality of memory logic modules, said at least one logic element being provided with a second memory that functions as a configuration memory, said second memory receiving said configuration data previously stored in said first memory, said configuration data being used to specify logic functions of said at least one logic element.

2. The programmable logic device as claimed in claim 1, wherein said configuration data, previously stored in said first memory, is written into said secondary memory via parallel lines provided between said first memory and said logic element.

3. The programmable logic device as claimed in claim 1, wherein said first memory stores logic processing data which is used when implementing the logic functions of said logic element.

4. The programmable logic device as claimed in claim 3, wherein said logic processing data are transferred between said first memory and said logic element by way of lines dedicated to said logic processing data.

5. A method of implementing configuration or reconfiguration of logic elements provided in a programmable logic device, comprising the steps of:
    writing a plurality of configuration data, which has previously been stored in an external circuit, into a first memory provided in each of a plurality of memory logic modules which are arranged in said programmable logic device in a two-dimensional array, said plurality of configuration data being associated with at least one logic element provided in each of said plurality of memory logic modules; and
    writing one of said plurality of configuration data into said at least one logic element in response to a signal instructing the configuration or the reconfiguration of said at least one logic element.

6. The method as claimed in claim 5, wherein said logic element is provided with a second memory into which said one of said plurality of configuration data is written from said first memory.

7. The method as claimed in claim 5, wherein said one of said plurality of configuration data stored in said first memory is transferred to said at least one logic element via parallel data lines.

8. The method as claimed in claim 5, wherein said first memory stores logic processing data which is used when implementing the logic functions of said at least one logic element.

9. The method as claimed in claim 8, wherein said logic processing data are transferred between said first memory and said at least one logic element by way of lines dedicated to said logic processing data.

* * * * *

UNITED STATES PATENT AND TRADEMARK OFFICE
CERTIFICATE OF CORRECTION

PATENT NO. : 6,172,521 B1  Page 1 of 1
DATED : January 9, 2001
INVENTOR(S) : Masato Motomura It is certified that error appears in the above-identified patent and that said Letters Patent is hereby corrected as shown below:

<u>Column 8, claim 2,</u>
Line 15, change "secondary" to -- second --.

Signed and Sealed this

Nineteenth Day of February, 2002

Attest:

*Attesting Officer*

JAMES E. ROGAN
*Director of the United States Patent and Trademark Office*